United States Patent
Suzuki et al.

(10) Patent No.: US 8,861,562 B2
(45) Date of Patent: Oct. 14, 2014

(54) VERTICAL LIGHT EMITTING DEVICE AND MANUFACTURING METHOD

(75) Inventors: Toshihito Suzuki, Tokyo (JP); Keishi Takaki, Tokyo (JP); Suguru Imai, Tokyo (JP); Yasumasa Kawakita, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 77 days.

(21) Appl. No.: 13/530,255

(22) Filed: Jun. 22, 2012

(65) Prior Publication Data

US 2013/0010822 A1  Jan. 10, 2013

(30) Foreign Application Priority Data

Jun. 24, 2011 (JP) ................................. 2011-141074

(51) Int. Cl.
*H01S 5/00* (2006.01)

(52) U.S. Cl.
USPC ................ 372/50.124; 372/44.01; 372/46.01; 372/50.11; 372/38.05

(58) Field of Classification Search
USPC ......... 372/44.01, 46.01, 50.11, 50.124, 38.05
See application file for complete search history.

(56) References Cited

U.S. PATENT DOCUMENTS

2005/0286597 A1* 12/2005 Mukoyama et al. ....... 372/50.23

FOREIGN PATENT DOCUMENTS

JP 2003332683 A 11/2003

* cited by examiner

*Primary Examiner* — Dung Nguyen
(74) *Attorney, Agent, or Firm* — Lowe Hauptman & Ham, LLP

(57) ABSTRACT

Provided is a vertical light emitting device comprising an upper multilayer reflective film and a lower multilayer reflective film that are formed facing each other and oscillate light; an intermediate layer that is formed below the upper multilayer reflective film and includes a layer having a different composition than the upper multilayer reflective film; and an electrode portion that is formed to sandwich the intermediate layer in a cross-sectional plane parallel to an oscillation direction of the light and to have a top end that is higher than a top surface of the intermediate layer. After the electrode portion is formed to sandwich the intermediate layer, the upper multilayer reflective film is layered on the intermediate layer.

16 Claims, 14 Drawing Sheets

VERTICAL LIGHT EMITTING DEVICE AND MANUFACTURING METHOD

BACKGROUND

1. Technical Field

The present invention relates to a vertical light emitting device and a method of manufacturing the same.

2. Related Art

A conventional vertical resonance surface emitting laser device is known in which a dielectric layer, such as a phase adjustment layer, is formed directly below an upper multilayer reflective mirror, as shown in Patent Document 1, for example. The upper multilayer reflective mirror is layered on the dielectric layer.

Patent Document 1: Japanese Patent Application Publication No. 2003-332683

By providing the dielectric layer, a level difference occurs in the surface on which the upper multilayer reflective mirror is layered. Therefore, each layer in the upper multilayer reflective mirror has an incline corresponding to this level difference. In other words, the central portion of each layer in the upper multilayer reflective mirror protrudes. When these layers are sequentially formed, the position of the inclination expands further outward in the higher layers. In this case, an unintended high-order transverse mode occurs in the output laser light.

SUMMARY

Therefore, it is an object of an aspect of the innovations herein to provide a vertical light emitting device, which is capable of overcoming the above drawbacks accompanying the related art. The above and other objects can be achieved by combinations described in the independent claims. According to a first aspect related to the innovations herein, provided is a vertical light emitting device comprising an upper multilayer reflective film and a lower multilayer reflective film that are formed facing each other and oscillate light; an intermediate layer that is formed below the upper multilayer reflective film and includes a layer having a different composition than the upper multilayer reflective film; and an electrode portion that is formed to sandwich the intermediate layer in a cross-sectional plane parallel to an oscillation direction of the light and to have a top end that is higher than a top surface of the intermediate layer.

According to a second aspect related to the innovations herein, provided is a method for manufacturing a vertical light emitting device, comprising forming an upper multilayer reflective film and a lower multilayer reflective film that face each other and oscillate light; forming an intermediate layer that is below the upper multilayer reflective film and includes a layer having a different composition than the upper multilayer reflective film; and forming an electrode portion that sandwiches the intermediate layer in a cross-sectional plane parallel to an oscillation direction of the light and has a top end that is higher than the top surface of the intermediate layer.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
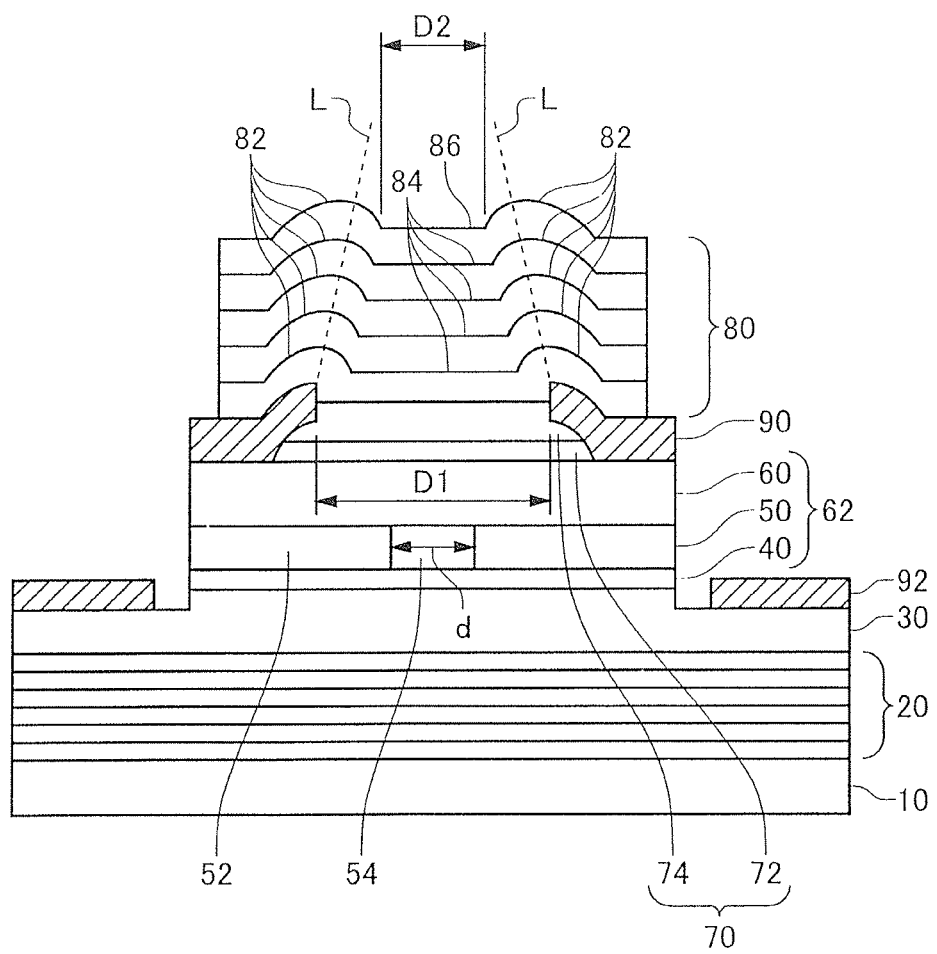
FIG. 1 shows a cross section of a surface emitting laser device according to a first embodiment of the present invention.

FIG. 1 shows a cross section of a vertical light emitting device according to a first embodiment of the present invention. The following describes the vertical light emitting device as a surface emitting laser device, but the vertical light emitting device is not limited to a surface emitting laser device. The vertical light emitting device may be any device that causes a level difference in a surface on which an upper multilayer reflective film is layered, by including an intermediate layer directly below the upper multilayer reflective film. The diagrams show the shape of the layers schematically, and the shapes of an intermediate layer 70, a p-type electrode portion 90, and an upper multilayer reflective film 80 are not limited to the shapes shown in the drawings.

The surface emitting laser device 100 includes a substrate 10, a lower multilayer reflective film 20, an n-type cladding layer 30, a mesa post 62, the intermediate layer 70, the upper multilayer reflective film 80, the p-type electrode portion 90, and an n-type electrode portion 92. The substrate 10 may be an undoped GaAs substrate.

The lower multilayer reflective film 20 is formed by epitaxially growing a multilayer semiconductor film on the substrate 10. Here, "up" is a direction away from the top surface of the substrate 10 and perpendicular to the top surface of the GaAs substrate 10. Furthermore, "down" is a direction that is the opposite of "up." In other words, "up" and "down" do not refer to the up and down directions relative to the orientation of the surface emitting laser device 100 when the surface emitting laser device 100 is implemented. The lower multilayer reflective film 20 is a multilayer semiconductor film mirror obtained by layering a plurality of composite layers that each include GaAs/AlGaAs, for example.

The n-type cladding layer 30 is formed on the lower multilayer reflective film 20. The n-type cladding layer 30 includes n-type GaAs, which is doped with an n-type dopant such as silicon (Si), for example. A portion of the top surface of the n-type cladding layer 30 may be included in the mesa post 62. In other words, a base portion of the mesa post may be formed in the top surface of the n-type cladding layer 30 in a region where the top surface contacts the mesa post 62.

The n-type electrode portion 92 is formed on the n-type cladding layer 30 in a manner to surround the mesa post 62. The n-type electrode portion 92 may be formed by a multilayer structure of AuGeNi/Au. The n-type electrode portion 92 is connected to an external circuit by an n-type lead electrode. The n-type electrode portion 92 need not contact the n-type cladding layer 30. An n-type contact layer may be interposed between the n-type electrode portion 92 and the n-type cladding layer 30.

The mesa post 62 is formed on the n-type cladding layer 30. The mesa post 62 includes an active layer 40, a current confinement layer 50, and a p-type cladding layer 60. The mesa post 62 may be formed as a circular pillar.

The active layer 40 is formed between the lower multilayer reflective film 20 and the intermediate layer 70, which is described below, and generates light. The active layer 40 of the present example is formed on the n-type cladding layer 30. The active layer 40 includes a multiquantum well structure obtained by alternately layering a GaInNAs quantum well layer and a GaAs barrier layer. The active layer 40 emits light due to a current injected from the p-type electrode portion 90.

The current confinement layer 50 is formed on the active layer 40. The current confinement layer 50 includes an aperture 54 and a selective oxidation layer 52. The current confinement layer 50 confines the current flowing from the p-type electrode portion 90 to focus this current in the aperture 54, thereby increasing the current density flowing into the active layer 40. The current confinement layer 50 includes a layer containing Al, such as an AlAs layer.

The selective oxidation layer 52 may be an annular insulating layer that includes $Al_2O_3$ formed as a result of oxidation from the edge of the mesa post 62. The aperture 54 is formed as a circle concentric with the selective oxidation layer 52. The aperture 54 may include AlAs having conductive characteristics. The p-type cladding layer 60 is formed on the current confinement layer 50. The p-type cladding layer 60 includes p-type GaAs that is doped with a p-type dopant such as carbon (C), for example.

The intermediate layer 70 is formed under the upper multilayer reflective film 80. The intermediate layer 70 of the present example is formed between the p-type cladding layer 60 and the upper multilayer reflective film 80. The intermediate layer 70 forms the portion of the top surface of the mesa post 62 that is not the border portion. The border portion may be a region with a prescribed width along the edge of the mesa post 62. In other words, the intermediate layer 70 creates a level difference on the top surface of the mesa post 62, and this level difference extends upward from the top surface of the mesa post 62 while moving toward the center from the edge.

The intermediate layer 70 includes a layer 72 with a composition differing from that of the upper multilayer reflective film 80. The layer 72 may be a phase adjustment layer, a protection layer, a non-linear layer, or an absorption layer, for example. A phase adjustment layer is formed of a dielectric material having a different refractive index than the mesa post 62, for example, and adjusts the phase of the laser light output of the surface emitting laser device 100. A protection layer is formed of a dielectric material, for example, and protects the top surface of the mesa post 62. A non-linear layer is formed of silicon nitride, for example, and generates a high-order harmonic by creating a non-linear optical effect for the laser light output by the surface emitting laser device 100. An absorption layer absorbs a high-order harmonic, for example.

The intermediate layer 70 may include a layer 74 made from a dielectric on the layer 72. The layer 74 may be a phase adjustment layer, a protection layer, a non-linear layer, or an absorption layer such as described above, or may be a portion of the upper multilayer reflective film 80. In other words, the intermediate layer 70 may include a layer having the same composition as the upper multilayer reflective film 80 at the interface between the intermediate layer 70 and the upper multilayer reflective film 80. In this case, the layer 74 also serves as the bottommost layer of the upper multilayer reflective film 80.

When the layer 74 is a portion of the upper multilayer reflective film 80, the upper multilayer reflective film 80 is layered after forming the intermediate layer 70 and the p-type electrode portion 90. The interface between the intermediate layer 70 and the upper multilayer reflective film 80 may be a relayered interface.

The p-type electrode portion 90 is formed on the p-type cladding layer 60 in a manner to sandwich the intermediate layer 70, in a cross section parallel to the oscillation direction of the light. Here, "sandwiching the intermediate layer 70" may mean that the outer periphery of the intermediate layer 70 is surrounded by the p-type electrode portion 90, or may mean that the edges of the intermediate layer 70 terminate at the p-type electrode portion 90. As another example, the intermediate layer 70 may refer to a region whose edge is formed further inward than the edge of the upper multilayer reflective film 80.

For example, the p-type electrode portion 90 may be formed on the p-type cladding layer 60 to have an annular shape surrounding the intermediate layer 70. The intermediate layer 70 and the p-type electrode portion 90 may be in contact with each other, but do not need to be in contact. The p-type electrode portion 90 may have a periphery that substantially matches the periphery of the mesa post 62.

The top end of the p-type electrode portion 90 is formed to be higher than the top surface of the intermediate layer 70. In other words, the p-type electrode portion 90 forms an indentation in the central portion of the layered surface of the upper multilayer reflective film 80. The edge of the p-type electrode portion 90 on the intermediate layer 70 side may extend to cover at least a portion of the intermediate layer 70. The p-type electrode portion 90 may be formed by a multilayer structure of Pt/Ti. The p-type electrode portion 90 is connected to an external circuit by a p-type lead electrode. The p-type electrode portion 90 and the intermediate layer 70 need not contact the p-type cladding layer 60. A p-type contact layer may be interposed between the p-type cladding layer 60 and the p-type electrode portion 90 and intermediate layer 70.

The upper multilayer reflective film 80 is formed on the intermediate layer 70 and the p-type electrode portion 90. If the intermediate layer 70 and the p-type electrode portion 90 are distanced from each other, the upper multilayer reflective film 80 may also be formed on the top surface of the mesa post 62 between the intermediate layer 70 and the p-type electrode portion 90. The lower multilayer reflective film 20 and the upper multilayer reflective film 80 are formed facing each other, and oscillate the light generated by the active layer 40. The upper multilayer reflective film 80 emits the laser light from the emitting surface 86, which is the topmost layer thereof. The upper multilayer reflective film 80 may be a multilayer semiconductor mirror obtained by layering a plurality of composite dielectric layers that each include SiN/SiO$_2$).

The upper multilayer reflective film 80 of the present example is layered on the intermediate layer 70 and the p-type electrode portion 90 after the p-type electrode portion 90 has been formed to sandwich the intermediate layer 70. Due to the indentation formed by the p-type electrode portion 90 and the intermediate layer 70, each layer of the upper multilayer reflective film 80 includes a concentric annular protruding portion 82 that extends upward. The upper multilayer reflective film 80 of the present example is sequentially layered on the indentation, and therefore the position of the protruding portion 82 moves inward, while progressing from the bottom layer to the top layer of the upper multilayer reflective film 80. By forming the p-type electrode portion 90 along the intermediate layer 70, the central edge is shaped to extend upward, and therefore there is a level difference portion on both the mesa post side and the center side of the top end of the electrode portion. As a result, compared to a case in which the level difference portion is only in the central region, the inward movement of the protruding portion 82 is smaller.

The lines L in FIG. 1 connect the peaks of the protruding portions 82 in each layer of the upper multilayer reflective film 80. As shown in FIG. 1, the two lines L are inclined in a manner to draw closer to each other whole moving from the bottom layer toward the top layer of the upper multilayer reflective film 80. Here, the direction of the two lines drawing closer together while moving from the bottom toward the top is referred to as "inward" and the opposite direction, which is the lines L moving away from each other, is referred to as "outward."

FIG. 1 shows the lines L as straight lines, but the upper multilayer reflective film 80 may be formed such that the lines L are curves. Each layer in the upper multilayer reflective film 80 has a flat portion 84 that is substantially flat at a location opposite the top surface of the intermediate layer 70. The flat portion 84 is the region surrounded by the protruding portion 82. The flat portions 84 of each layer of the upper multilayer reflective film 80 are substantially parallel to each other and are concentric. In other words, the flat portion 84 in each layer is formed to be further inward than the flat portion 84 of the layer immediately therebelow. The surface areas of the flat portions 84 in each layer of the upper multilayer reflective film 80 gradually decrease according to the distance from the intermediate layer 70. In other words, the diameters of the flat portions 84 gradually decrease while moving from the bottom layer toward the top layer of the upper multilayer reflective film 80. Therefore, the high-order transverse mode in the laser light output by the surface emitting laser device 100 can be restricted. Here, since there is a level difference both toward the center and toward the outside from the top end of the electrode, the inward movement of the protruding portion 82 is small. Accordingly, the high-order transverse mode alone can be restricted, without causing loss or distortion in the mode field of the basic transverse mode.

With the diameter of the flat portion in the topmost layer of the upper multilayer reflective film in FIG. 1 represented as D2, the diameter of the opening surrounded by the electrode represented as D1, and the diameter of the opening of the current confinement layer 50 represented as d, the relationship d<D2<D1<3d is preferably satisfied. Here, the flat portion of the topmost layer refers to the flat portion surrounded by the protruding portion 82 on the topmost layer of the upper multilayer reflective film 80. At this time, in order to realize high operating speed exceeding 10 Gbps and a low threshold of 1 mA or less, for example, it is preferable that d<10 μm. If D1>D2, the high-order mode can be restricted. If D2>d, loss in the basic transverse mode can be restricted.

Figure 2:
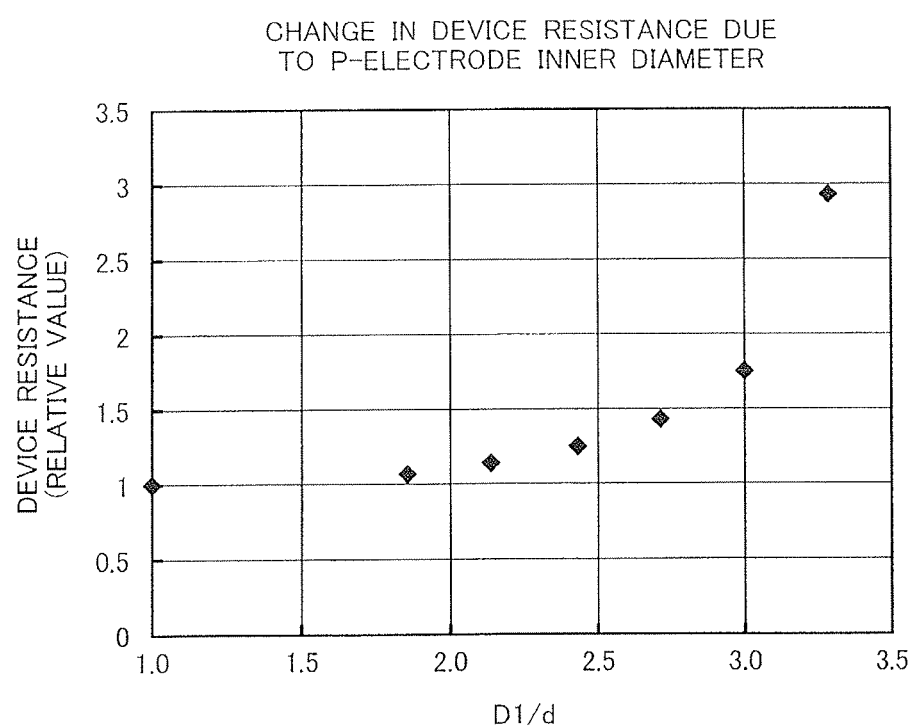
FIG. 2 is a graph of change in device resistance caused by the inner diameter of the p-electrode.

FIG. 2 shows the relationship between device resistance (relative value) and D1/d, which is the ratio between the diameter D1 of the aperture surrounded by the electrode and the diameter d of the opening of the current confinement layer 50, for the surface emitting laser device 100. As shown in FIG. 2, if d<D1<3d, the device resistance can be sufficiently restricted. Furthermore, if 1.5d<D1, the loss for the electrode can be reduced, and therefore such a relationship is preferable.

A portion of the top surface of the n-type cladding layer 30, the active layer 40, the current confinement layer 50, the p-type cladding layer 60, the intermediate layer 70, the p-type electrode portion 90, and the upper multilayer reflective film 80 may be formed as a cylindrical pillar to form the mesa post 62.

Figure 3:
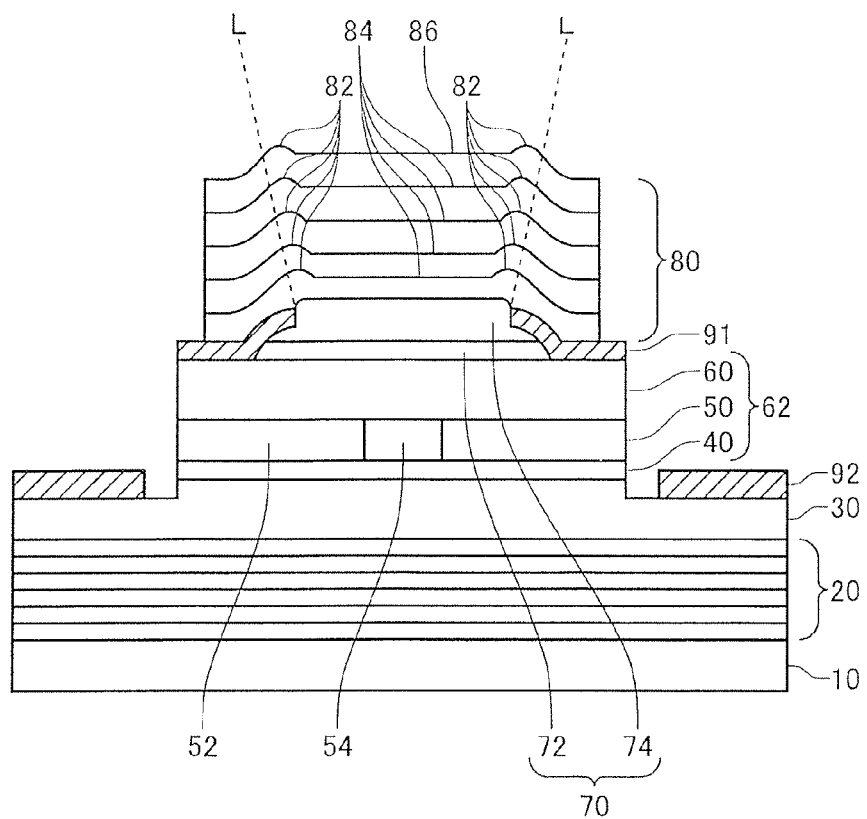
FIG. 3 shows a cross section of a surface emitting laser device used as a comparative example.

FIG. 3 shows a cross section of a surface emitting laser device 500 used as a comparative example. In the surface emitting laser device 500, the p-type electrode portion 91 and the upper multilayer reflective film 80 are different from the p-type electrode portion 90 and the upper multilayer reflective film 80 in the surface emitting laser device 100 of the first embodiment. The remaining structure is the same as in the surface emitting laser device 100.

The top end of the p-type electrode portion 91 is positioned lower than the top surface of the intermediate layer 70. In other words, the p-type electrode portion 91 and the intermediate layer 70 form a level difference portion by having a center portion protruding upward directly below the upper multilayer reflective film 80. Each layer of the upper multilayer reflective film 80 layered on the intermediate layer 70 includes a concentric circular protruding portion 82 formed by this level difference portion. In this example, the two lines L connecting the peaks of the protruding portions 82 in each layer extend outward. In other words, the surface areas of the flat portions 84 in each layer gradually increase while moving from the bottom surface toward the top surface. In this case, it is difficult to restrict the high-order transverse mode of the laser light output by the surface emitting laser device 500.

Figure 4:
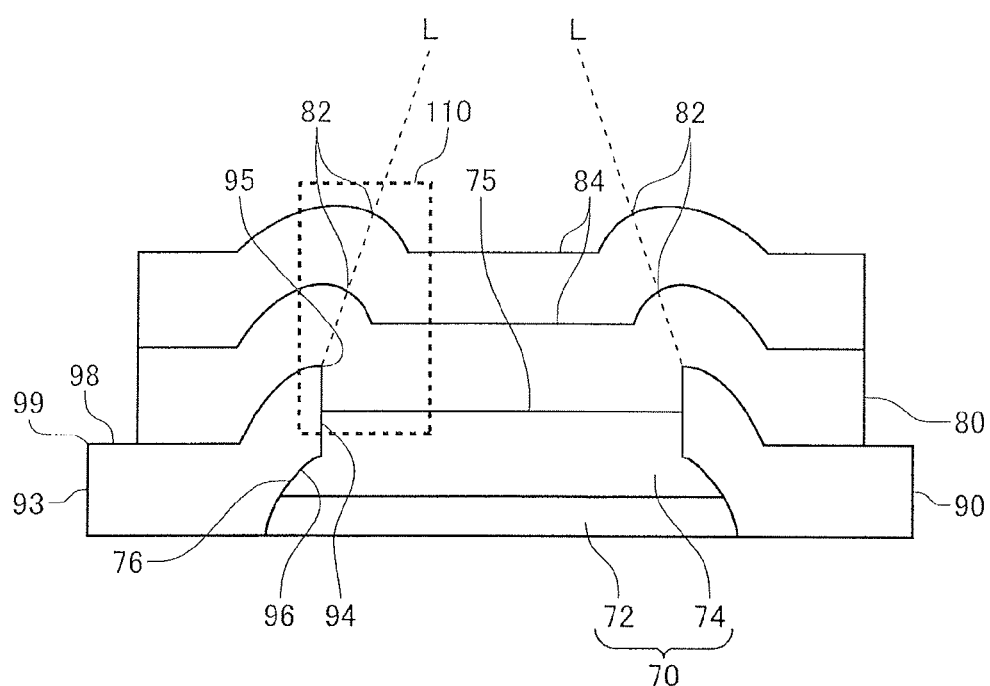
FIG. 4 is an enlarged view of a portion of the surface emitting laser device shown in FIG. 1.

FIG. 4 is an enlarged view of a portion of the cross section of the surface emitting laser device 100 shown in FIG. 1. The p-type electrode portion 90 includes an edge 93 on the border side of the mesa post 62 and an edge 94 on the intermediate layer 70 side. The top end 95 of the edge 94 is positioned higher than the top surface 75 of the intermediate layer 70. Therefore, the p-type electrode portion 90 and the intermediate layer 70 cause an indentation to be formed in the central portion of the surface on which the upper multilayer reflective film 80 is formed.

The edge 94 of the p-type electrode portion 90 on the intermediate layer 70 side may extend to be higher than at least one of the edge 93 on the mesa post 62 border side and the central portion of the p-type electrode portion 90. The central portion of the p-type electrode portion 90 is the top surface of the p-type electrode portion 90 located between the top end 99 of the edge 93 of the p-type electrode portion 90 and the top end 95 of the edge 94. The edge 93 may be formed to contact the p-type cladding layer 60 (see FIG. 1), and the edge 94 may be distanced from the p-type cladding layer 60.

In this case, the thickness of the p-type electrode portion 90 may be substantially the same at the edge 94 and the edge 93.

At the interface between the p-type electrode portion 90 and the p-type cladding layer 60, it is easy for localized strain to occur due to reactions with the Ti or the like forming the p-type electrode portion 90. This strain causes dislocation in the layered semiconductor structure. When this dislocation occurs near the light emitting region directly below the aperture 54 of the active layer 40, the laser characteristics are degraded. Therefore, the p-type electrode portion 90 is formed such that the distance between the active layer 40 and the top end 95 of the edge 94 of the p-type electrode portion 90 on the intermediate layer 70 side is greater than at least one of the distance between the active layer 40 and the top end 99 of the edge 93 on the mesa post 62 border side and the distance between the active layer 40 and the central portion of the p-type electrode portion 90. As a result, the strain is restricted and dislocation in the active layer 40 can be prevented.

The intermediate layer 70 may include an inclined side surface 76. The inclined side surface 76 may refer to a surface with a linear incline and/or a surface with a curved incline. The p-type electrode portion 90 is formed along the side surface 76 of the intermediate layer 70. Here, being formed "along the side surface 76" means that the bottom surface 96 of the edge 94 contacts the inclined side surface 76. In other words, the edge 94 of the p-type electrode portion 90 covers the inclined side surface 76 of the intermediate layer 70. Furthermore, the p-type electrode portion 90 may include a planar portion 98 formed lower than the top end 95. The planar portion 98 refers to a region on the top surface of the p-type electrode portion 90 that is formed to be flat. In addition, the planar portion 98 may be positioned such that the distance from the center of the intermediate layer 70 in a direction perpendicular to the oscillation direction is greater than the distance from the center of the intermediate layer 70 to the top end 95. In other words, the planar portion may be formed in a manner to sandwich the top end 95 of the p-type electrode portion 90 between itself and the top surface 75 of the intermediate layer 70.

Figure 5:
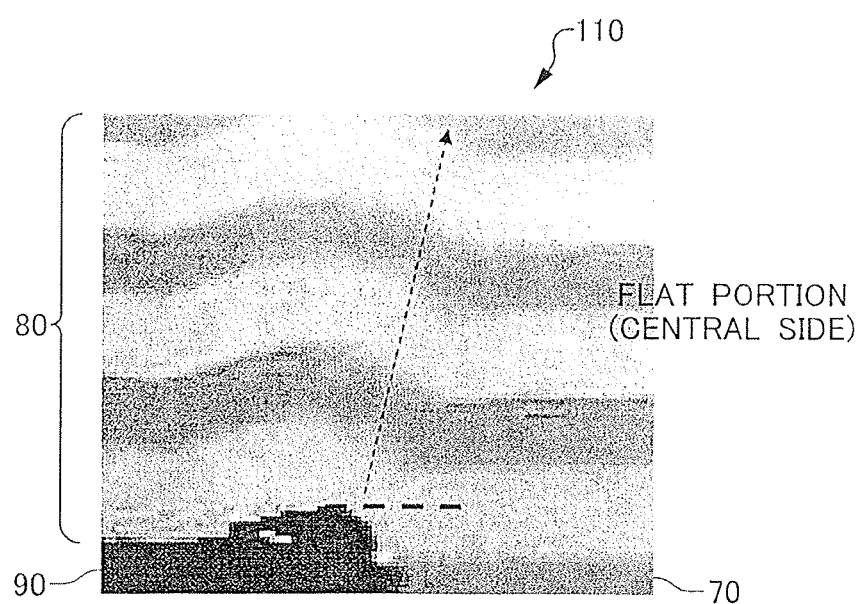
FIG. 5 is a cross section TEM photograph of an enlarged portion of FIG. 4.

FIG. 5 is a cross section TEM photograph of the surface emitting laser device 100 in the region 110 of FIG. 4. In FIG. 5, the dashed line extending horizontally indicates the position of the top end 95 of the p-type electrode portion 90. The arrow in FIG. 5 indicates the direction of the straight line connecting the peaks of the protruding portion 82.

As shown in FIG. 5, the top end 95 of the p-type electrode portion 90 is positioned higher than the top surface of the intermediate layer 70. As a result, the protruding portions 82 in each layer of the upper multilayer reflective film 80 face inward. Therefore, the surface areas of the flat portions 84 in each layer become gradually smaller while moving from the bottom layer toward the top layer.

Figure 6:
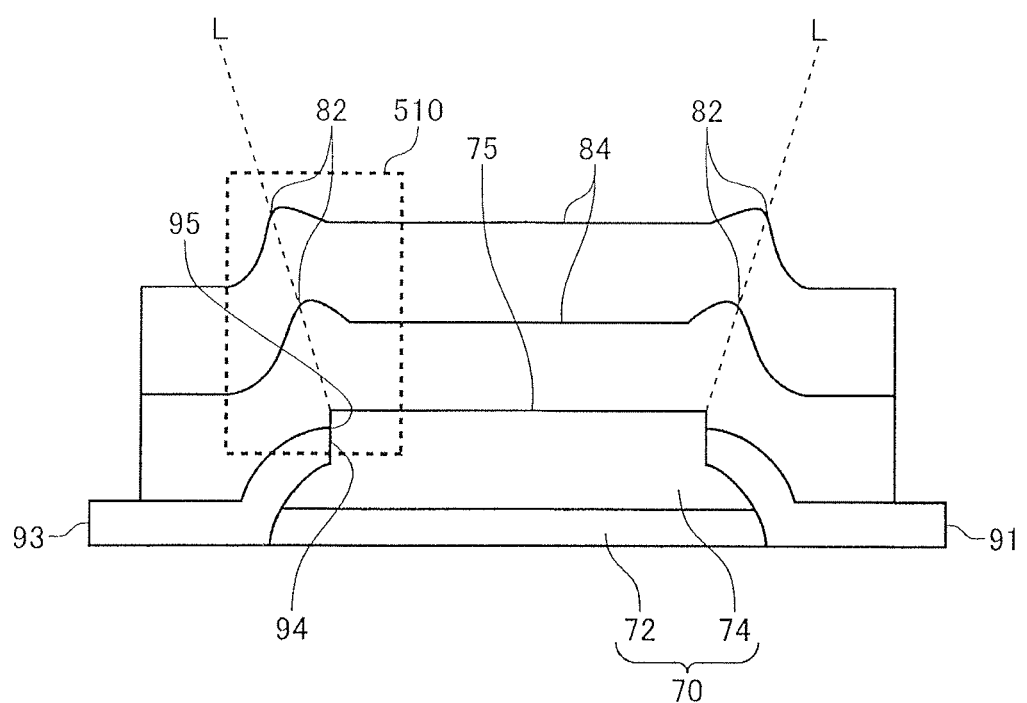
FIG. 6 is an enlarged view of a portion of the surface emitting laser device shown in FIG. 3.

FIG. 6 shows an enlarged portion of the cross section of the surface emitting laser device 500 shown in FIG. 3. The top end 95 of the edge 94 of the p-type electrode portion 91 on the intermediate layer 70 side is positioned lower than the top surface 75 of the intermediate layer 70.

Figure 7:
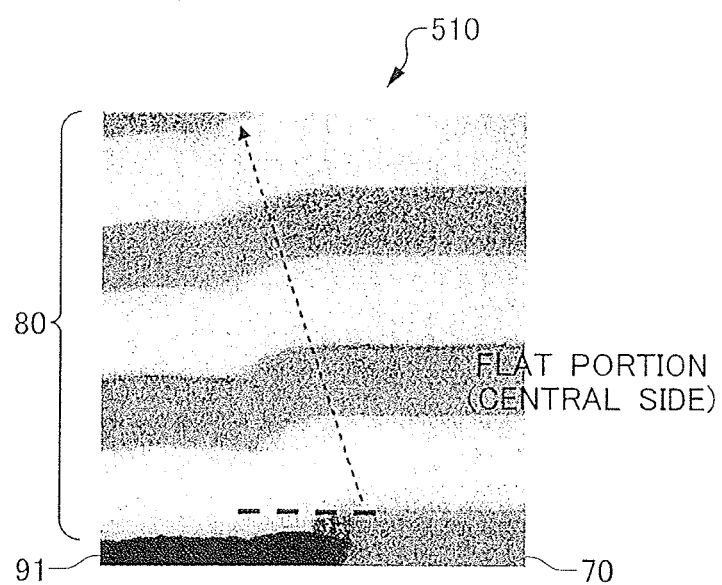
FIG. 7 is a cross section TEM photograph of an enlarged portion of FIG. 6.

FIG. 7 is a cross section TEM photograph of the surface emitting laser device 500 in the region 510 of FIG. 6. In FIG. 6, the dashed line extending horizontally indicates the position of the top surface of the intermediate layer 70. The arrow in FIG. 6 indicates the direction of the straight line connecting the peaks of the protruding portions 82.

The top end 95 of the p-type electrode portion 91 is positioned lower than the top surface of the intermediate layer 70. As a result, the protruding portions 82 in each layer of the upper multilayer reflective film 80 face outward. Therefore, the surface areas of the flat portions 84 in each layer become gradually larger while moving from the bottom layer toward the top layer.

Figure 8:
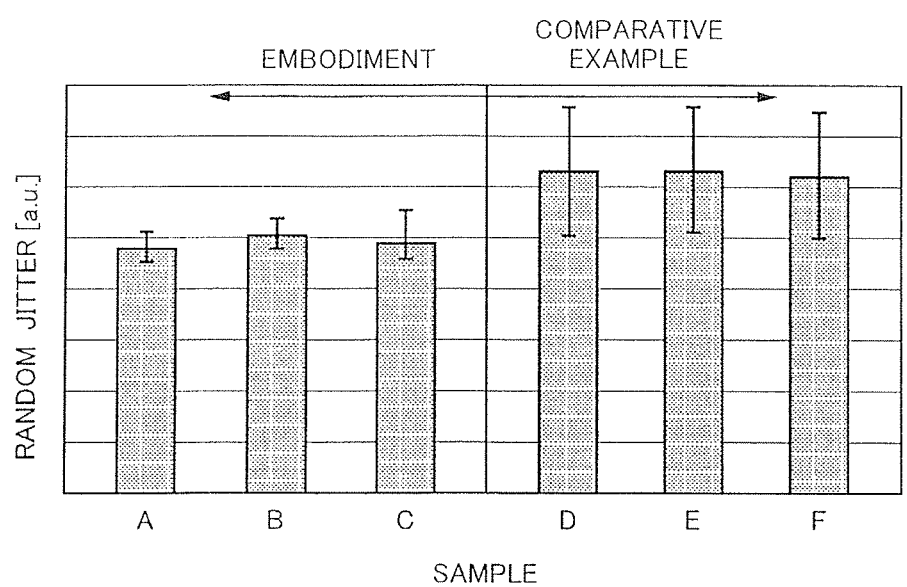
FIG. 8 is a graph showing experimental results obtained by measuring the random jitter in the surface emitting laser device shown in FIG. 1 and the surface emitting laser device shown in FIG. 3.

FIG. 8 shows measurement results obtained by measuring the random jitter component in the laser light output by surface emitting laser devices of the present embodiment and of the comparative example. Three sample devices (A, B, C) having the same structure as shown in FIG. 5 were used as surface emitting laser devices 100 of the present embodiment. Three sample devices (D, E, F) having the same structure as shown in FIG. 7 were used as surface emitting laser devices 500 of the comparative example. The jitter values shown in FIG. 8 are relative values.

Based on the graph, it is understood that the surface emitting laser devices 100 in which the protruding portions 82 are oriented inward can decrease the random jitter by more than the surface emitting laser devices 500 in which the protruding portions 82 are oriented outward. This is believed to be because the loss of light is caused by the protruding portions 82 in each layer of the upper multilayer reflective film 80. By forming the protruding portions 82 to be oriented inward, the loss of light of the high-order transverse mode leaking outside of the aperture 54 can be increased. As a result, the oscillation of the high-order transverse mode is restricted and the random jitter can be decreased.

Figure 9:
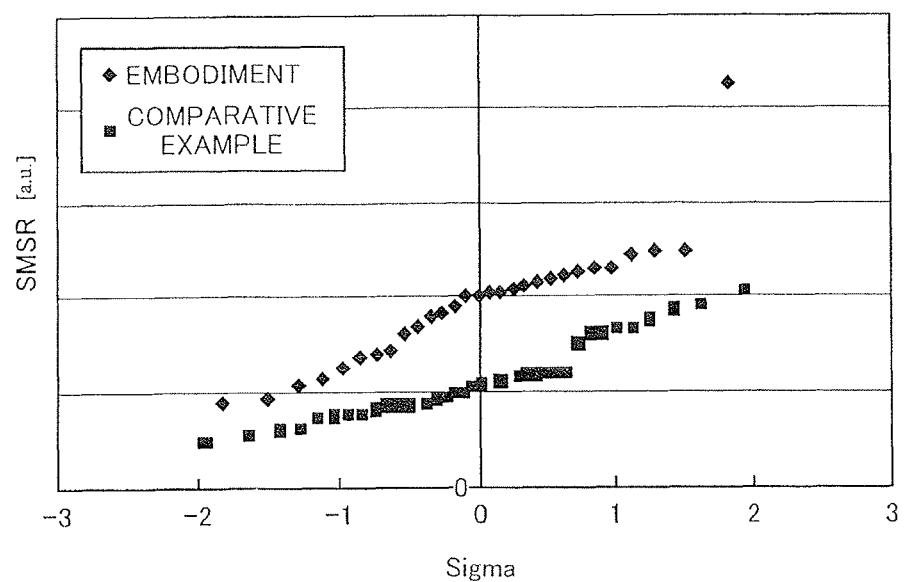
FIG. 9 is a graph showing experimental results obtained by measuring change in SMSR values with respect to sigma values, for the surface emitting laser device shown in FIG. 1 and the surface emitting laser device shown in FIG. 3.

FIG. 9 shows measurement results of a side mode suppression ratio (SMSR) for a surface emitting laser device 500 of the comparative example and a surface emitting laser device 100 of the present embodiment. The vertical axis of FIG. 9 indicates a relative value when the SMSR is expressed in decibel value. FIG. 9 assumes a normal distribution for the cumulative frequency distribution of the SMSR measured for the surface emitting laser devices 500, and the horizontal axis (sigma) indicates a value obtained by converting frequency to (shift from an average value)/(standard deviation). As a result of this conversion, if the frequency distribution of the measured values is close to a normal distribution, the graph of FIG. 9 is linear.

As shown in FIG. 9, the for all values of sigma, the surface emitting laser device 100 in which the protruding portion 82 is oriented inward has a higher SMSR value than the surface emitting laser device 500 in which the protruding portion 82 is oriented outward. Based on the experimental results, it is understood that the surface emitting laser device 100 can restrict high-order transverse mode light.

Figure 10:
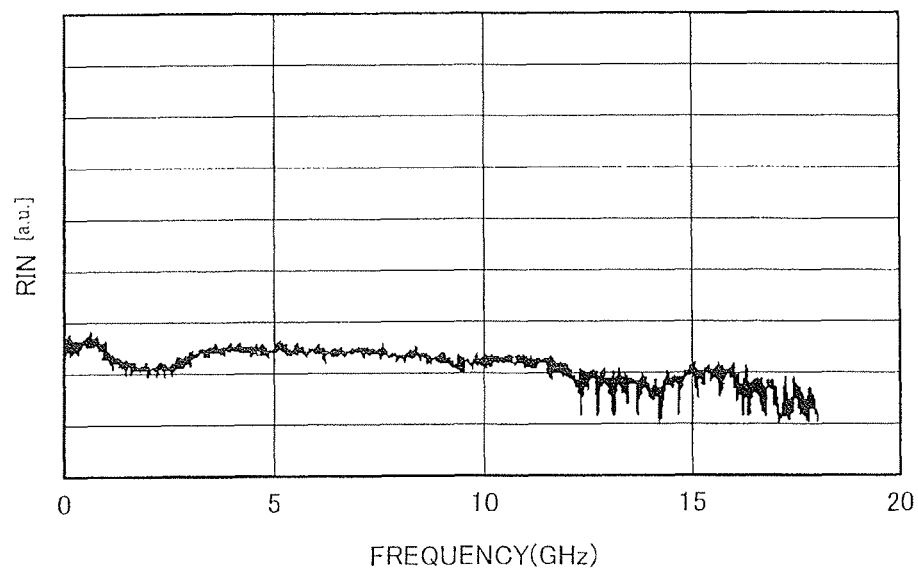
FIG. 10 is a graph showing experimental results obtained by measuring change in RIN with respect to frequency, for the surface emitting laser device shown in FIG. 3.
Figure 11:
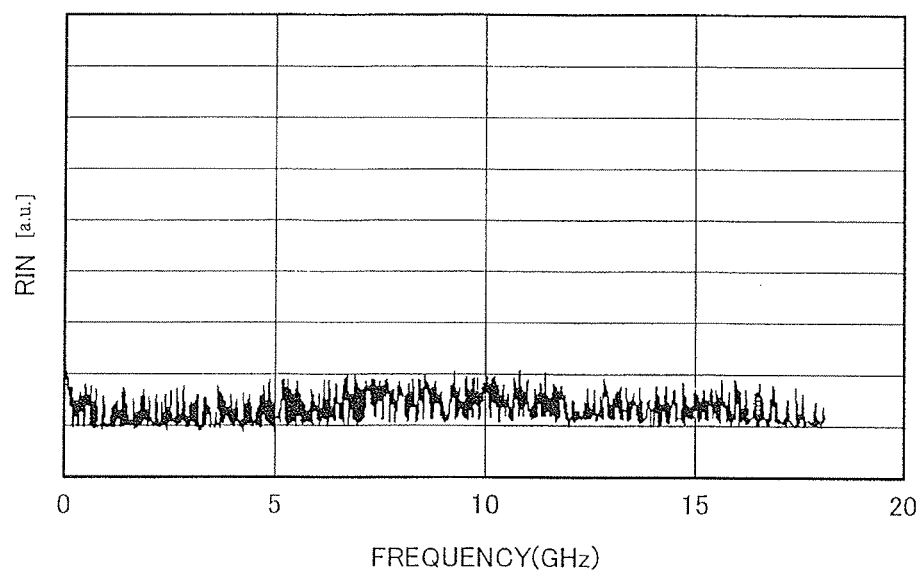
FIG. 11 is a graph showing experimental results obtained by measuring change in RIN with respect to frequency, for the surface emitting laser device shown in FIG. 1.

FIG. 10 shows experimental results obtained by measuring the relationship between the frequency and the relative intensity noise (RIN) for the surface emitting laser device 500. FIG. 11 shows experimental results obtained by measuring the relationship between the frequency and the relative intensity noise (RIN) for the surface emitting laser device 100. The vertical axes in FIGS. 10 and 11 indicate relative values when RIN is expressed in dB/Hz. In the frequency band from 0 GHz to approximately 16 GHz, the surface emitting laser device 100 exhibits lower RIN than the surface emitting laser device 500. Based on these experimental results as well, it is understood that the surface emitting laser device 100 restricts light of the high-order transverse mode.

Based on the above experimental results, the occurrence of the high-order transverse mode of the surface emitting laser device can be restricted by orienting the protruding portions 82 of each layer of the upper multilayer reflective film 80 inward, thereby forming the upper multilayer reflective film 80 such that the surface areas of the flat portions 84 gradually decrease while moving from the bottom layer toward the top layer.

The following describes a method for manufacturing the surface emitting laser device 100. The surface emitting laser device 100 manufacturing method includes a semiconductor layer formation step of epitaxially layering the lower multilayer reflective film 20, the n-type cladding layer 30, the active layer 40, the current confinement layer 50, and the p-type cladding layer 60 on the GaAs substrate 10 using MOCVD, for example, an intermediate layer formation step of depositing the intermediate layer 70, a p-type electrode formation step of forming the p-type electrode portion 90, a mesa post formation step of forming the mesa post 62, an n-type electrode formation step of forming the n-type electrode portion 92, and an upper multilayer reflective film formation step of depositing the upper multilayer reflective film 80.

The semiconductor layer formation step includes growing the lower multilayer reflective film 20 on the surface of the GaAs substrate 10. The lower multilayer reflective film 20 is formed by layering 34 pairs of a composite semiconductor layer including GaAs/AlGaAs, for example. Each layer in the composite semiconductor layer has a thickness of $\lambda/4n$, where $\lambda$ is the oscillation wavelength and n is the refractive index. Next, the n-type cladding layer 30 including n-type GaAs doped with an n-type dopant such as silicon, for example, is grown on the surface of the topmost layer of the lower multilayer reflective film 20. After this, the active layer 40, which has a multiquantum well structure obtained by alternately layering three GaInNAs quantum well layers and four GaAs barrier layers, for example, is formed on the surface of the n-type cladding layer 30. The current confinement layer 50 including a layer containing Al, such as AlAs, for example, is then grown on the surface of the active layer 40. Next, the p-type cladding layer 60 including p-type GaAs doped with a p-type dopant such as carbon, for example, is grown on the surface of the current confinement layer 50.

The intermediate layer formation step includes layering the layer 72, which may be a phase adjustment layer having a different composition than the upper multilayer reflective film 80, for example, on the surface of the p-type cladding layer 60. The intermediate layer formation step may include further depositing a layer 74, which includes a dielectric having the same composition as the upper multilayer reflective film 80, on the surface of the layer 72. After the layers 72 and 74 are deposited, a mask is formed by patterning a resist using photolithography. Next, dry etching is used to form the intermediate layer 70.

The p-type electrode formation step includes a step of forming the mask by patterning the resist using photolithography, a step of sputtering a multilayer metal film such as Pt/Ti, and a step of forming the annular p-type electrode portion 90 by lifting off the mask. The lift off technique is used to form the p-type electrode portion 90 along the inclined side surface of the intermediate layer 70.

The mesa post formation step includes a step of masking the p-type electrode portion 90 and using anisotropic etching to etch the semiconductor layer until reaching the n-type cladding layer 30 to form the cylindrical mesa post 62. Furthermore, the mesa post formation step includes forming the selective oxidation layer 52 in the current confinement layer 50 by heating the current confinement layer 50 for a prescribed time in a steam atmosphere. The selective oxidation layer 52 is formed by oxidizing the Al from the border of the mesa post 62 such that the Al changes to $Al_2O_3$.

The n-type electrode formation step includes a step of forming the C-shaped n-type electrode portion 92 to surround the mesa post 62 on the surface of the exposed n-type cladding layer 30. The n-type electrode portion 92 is formed by a multilayer metal structure of AuGeNi/Au, for example, using the lift off technique.

The upper multilayer reflective film formation step includes a step of layering 10 to 12 pairs of a composite semiconductor layer including $SiN/SiO_2$, for example, on at least a portion of the surfaces of the p-type electrode portion and the intermediate layer 70 using plasma CVD. Each layer of the composite semiconductor layer may have a thickness of $\lambda/4n$. The upper multilayer reflective film formation step may be performed after the p-type electrode formation step and before the mesa post formation step. In this case, a mask is formed on the topmost portion of the upper multilayer reflective film 80 and anisotropic etching may be used to form the mesa post.

Figure 12:
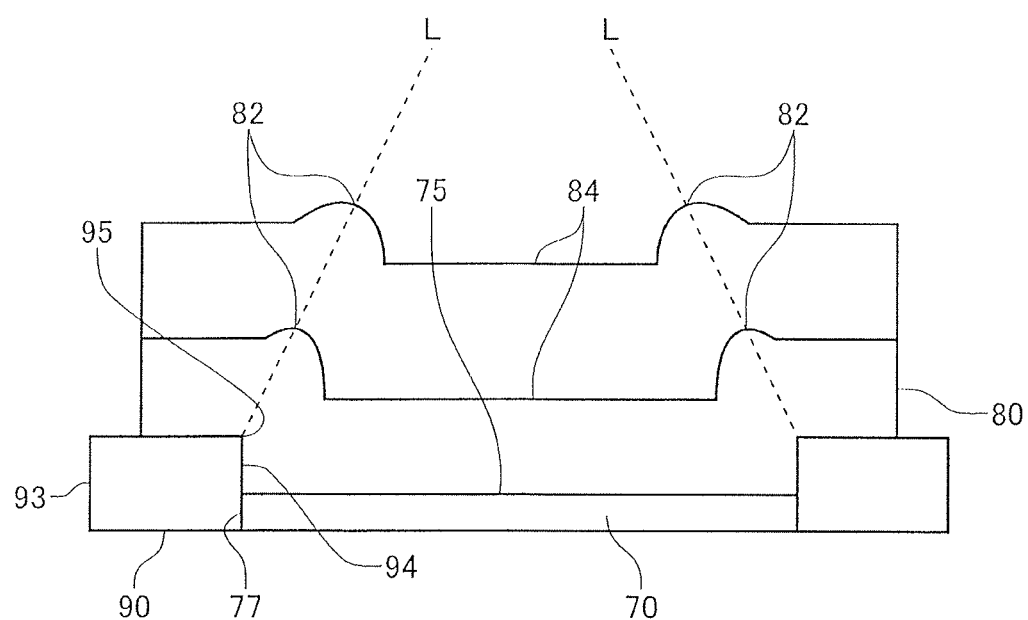
FIG. 12 shows an enlarged portion of a modification of the surface emitting laser device.

FIG. 12 shows a portion of a cross section of a surface emitting laser device 200 according to a modification. In the surface emitting laser device 200, portions that have the same function as in the surface emitting laser device 100 are given the same reference numerals and further explanation is omitted. The surface emitting laser device 200 differs from the first embodiment in that the intermediate layer 70 includes a vertical side surface 77 and the p-type electrode portion 90 is formed to be thicker than the intermediate layer 70. The top end 95 of the edge 94 is positioned higher than the top surface 75 of the intermediate layer 70. The p-type electrode portion 90 is formed to contact the intermediate layer 70. More specifically, the vertical side surface 77 of the intermediate layer 70 contacts the edge surface of the edge 94.

The thickness of the edge 93 of the p-type electrode portion 90 on the mesa post 62 border side may be equal to or different from the thickness of the edge 94 on the intermediate layer 70 side. When the p-type electrode portion 90 and intermediate layer 70 are formed in this way, an indentation is formed in the central portion of the surface on which the upper multilayer reflective film 80 is formed. Accordingly, the protruding portions 82 in each layer of the upper multilayer reflective film 80 can be oriented inward.

Figure 13:
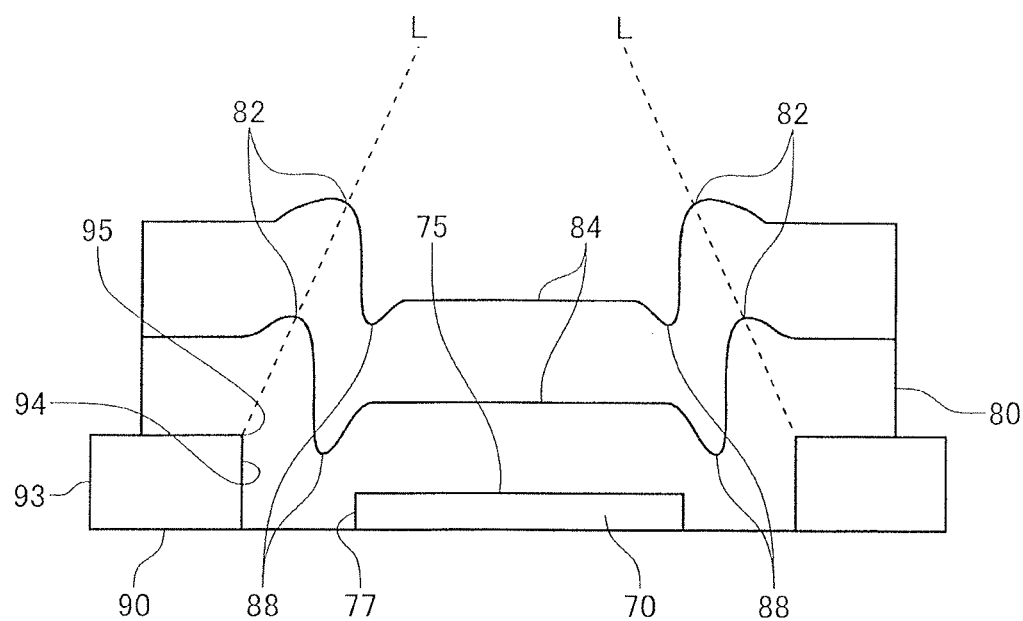
FIG. 13 shows an enlarged portion of another modification of the surface emitting laser device.

FIG. 13 shows a portion of a cross section of a surface emitting laser device 300 according to another modification. The surface emitting laser device 300 differs from the surface emitting laser device 200 in that the p-type electrode portion 90 is formed at a distance from the intermediate layer 70. In other words, the side surface 77 of the intermediate layer 70 is formed at a prescribed distance from the edge surface of the edge 94 of the p-type electrode portion 90 on the intermediate layer 70 side.

With this configuration as well, an indentation is formed in the central portion of the surface on which the upper multilayer reflective film 80 is formed. Each layer of the upper multilayer reflective film 80 may include a groove 88 between the protruding portion 82 and the flat portion 84, corresponding to the separation between the p-type electrode portion 90 and the intermediate layer 70. The top end 95 of the p-type electrode portion 90 is positioned higher than the top surface 75 of the intermediate layer 70. The thickness of the edge 93 of the p-type electrode portion 90 on the mesa post 62 border side may be the same as or different from the thickness of the edge 94 on the intermediate layer 70 side. By forming the p-type electrode portion 90 and the intermediate layer 70 in this way, the protruding portions 82 in each layer of the upper multilayer reflective film 80 can be oriented inward. Due to the level difference realized by the formation of the intermediate layer 70 and the level difference of the edge of the electrode portion 90 on the intermediate layer side, the amount by which the flat portion of the multilayer reflective mirror decreases can be lessened.

Figure 14:
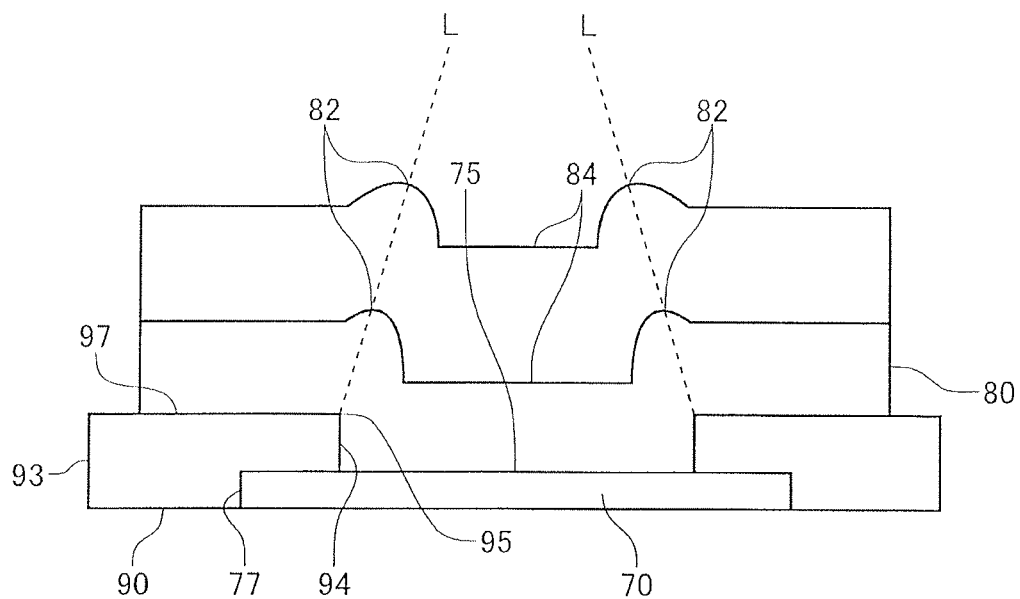
FIG. 14 shows an enlarged portion of another modification of the surface emitting laser device.

FIG. 14 shows a portion of a cross section of a surface emitting laser device 400 according to another modification. The surface emitting laser device 400 differs from the surface emitting laser device 100 and the surface emitting laser device 200 in that a portion of the p-type electrode portion 90 is formed on the top surface 75 of the intermediate layer 70. The remaining configuration may be the same as that of the surface emitting laser device 100 or the surface emitting laser device 200.

The edge 94 of the p-type electrode portion 90 on the intermediate layer 70 side is formed to extend along the top surface 75 of the intermediate layer 70 from the side surface 77 of the intermediate layer 70. In other words, the outer circumferential portion of the intermediate layer 70 is covered by the p-type electrode portion 90. The top end 95 of the p-type electrode portion 90 is positioned higher than the top surface 75 of the intermediate layer 70. The top surface 97 of the p-type electrode portion 90 need not be parallel with the top surface 75 of the intermediate layer 70. By forming the p-type electrode portion 90 and the intermediate layer 70 in this way, the protruding portions 82 in each layer of the upper multilayer reflective film 80 can be oriented inward. Furthermore, the distance between the active layer 40 and the edge 94 of the p-type electrode portion 90 on the intermediate layer 70 side is greater than the distance between the active layer 40 and the edge 93 on the mesa post 62 border side. Accordingly, strain is restricted and dislocation in the active layer 40 can be prevented.

While the embodiments of the present invention have been described, the technical scope of the invention is not limited to the above described embodiments. For example, the electrode portion forming the level difference portion may be a semiconductor layer, a dielectric layer, or a metal layer. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to provide a vertical light emitting device that can restrict the high-order transverse mode.

What is claimed is:

1. A vertical light emitting device comprising:
an upper multilayer reflective film and a lower multilayer reflective film that are formed facing each other and oscillate light;
an intermediate layer that is formed below the upper multilayer reflective film and includes a layer having a different composition than the upper multilayer reflective film; and
an electrode portion that is formed to sandwich the intermediate layer in a cross-sectional plane parallel to an oscillation direction of the light and to have a top end that is higher than a top surface of the intermediate layer, wherein
the upper multilayer reflective film covers the intermediate layer and the top end of the electrode portion that is higher than the top surface of the intermediate layer.

2. The vertical light emitting device according to claim 1, wherein
after the electrode portion is formed to sandwich the intermediate layer, the upper multilayer reflective film is layered on the intermediate layer.

3. The vertical light emitting device according to claim 1, further comprising a mesa post in which the intermediate layer, the electrode portion, and the upper multilayer reflective film are formed, wherein
the top end of an edge of the electrode portion on the intermediate layer side extends higher than at least one of the top end of the edge on the mesa post border side and a central portion of the electrode portion.

4. The vertical light emitting device according to claim 1, wherein
the intermediate layer includes a vertical side surface, and the electrode portion is thicker than the intermediate layer.

5. The vertical light emitting device according to claim 1, wherein
a part of the electrode portion is formed on a top surface of the intermediate layer.

6. The vertical light emitting device according to claim 3, further comprising an active layer that generates light and is formed between the intermediate layer and the lower multilayer reflective film, wherein
a distance between the active layer and the top end of the edge of the electrode portion on the intermediate layer side is greater than at least one of a distance between the active layer and the top end of the edge on the mesa post border side and a distance between the active layer and the central portion of the electrode portion.

7. The vertical light emitting device according to claim 1, wherein
the electrode portion is formed to contact the intermediate layer.

8. The vertical light emitting device according to claim 4, wherein
the electrode portion is formed at a distance from the intermediate layer.

9. The vertical light emitting device according to claim 1, wherein
the intermediate layer includes a dielectric layer.

10. A vertical light emitting device comprising:
an upper multilayer reflective film and a lower multilayer reflective film that are formed facing each other and oscillate light;
an intermediate layer that is formed below the upper multilayer reflective film and includes a layer having a different composition than the upper multilayer reflective film; and
an electrode portion that is formed to sandwich the intermediate layer in a cross-sectional plane parallel to an oscillation direction of the light and to have a top end that is higher than a top surface of the intermediate layer, wherein
the electrode portion includes a planar portion formed lower than the top end of the electrode portion, and
the planar portion is positioned such that a distance from the center of the intermediate layer to the planar portion in a direction perpendicular to the oscillation direction is greater than a distance from the center of the intermediate layer to the top end.

11. The vertical light emitting device according to claim 10, wherein the intermediate layer includes an inclined side surface, and the electrode portion is formed along the side surface of the intermediate layer.

12. The vertical light emitting device according to claim 10, wherein each layer in the upper multilayer reflective film includes a flat portion that is substantially flat and positioned opposite a top surface of the intermediate layer, and surface areas of the flat portions decrease according to distance from the intermediate layer.

13. The vertical light emitting device according to claim 10, further comprising:

an active layer that generates light and is formed between the intermediate layer and the lower multilayer reflective film; and a current confinement layer that is formed between the active layer and the intermediate layer, wherein with d representing diameter of an aperture of the current confinement layer, D1 representing aperture diameter of the electrode portion, and D2 representing diameter of a flat portion in a topmost layer of the upper multilayer reflective film, a condition of d<D2<D1<3d is fulfilled.

14. A method for manufacturing a vertical light emitting device, comprising:

forming an upper multilayer reflective film and a lower multilayer reflective film that face each other and oscillate light;

forming an intermediate layer that is below the upper multilayer reflective film and includes a layer having a different composition than the upper multilayer reflective film; and forming an electrode portion that sandwiches the intermediate layer in a cross-sectional plane parallel to an oscillation direction of the light and has a top end that is higher than a top surface of the intermediate layer, wherein the upper multilayer reflective film is formed to cover the intermediate layer and the top end of the electrode portion that is higher than the top surface of the intermediate layer.

15. The manufacturing method according to claim 14, wherein the electrode portion is formed after forming the intermediate layer, and the upper multilayer reflective film is layered on the intermediate layer after the electrode portion is formed.

16. A method for manufacturing a vertical light emitting device, comprising:

forming an upper multilayer reflective film and a lower multilayer reflective film that face each other and oscillate light;

forming an intermediate layer that is below the upper multilayer reflective film and includes a layer having a different composition than the upper multilayer reflective film; and forming an electrode portion that sandwiches the intermediate layer in a cross-sectional plane parallel to an oscillation direction of the light and has a top end that is higher than the top surface of the intermediate layer, wherein the electrode portion is formed after forming the intermediate layer, the upper multilayer reflective film is layered on the intermediate layer after the electrode portion is formed, forming the intermediate layer includes etching the intermediate layer such that a side surface of the intermediate layer is inclined, and forming the electrode portion includes forming the electrode portion along the side surface of the intermediate layer.

* * * * *